(12) United States Patent
Hao et al.

(10) Patent No.: US 10,490,156 B2
(45) Date of Patent: Nov. 26, 2019

(54) SHIFT REGISTER, GATE DRIVING CIRCUIT AND DISPLAY PANEL

(71) Applicant: BOE TECHNOLOGY GROUP CO., LTD., Beijing (CN)

(72) Inventors: Xueguang Hao, Beijing (CN); Hongfei Cheng, Beijing (CN); Xinyin Wu, Beijing (CN); Yong Qiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 90 days.

(21) Appl. No.: 15/699,164

(22) Filed: Sep. 8, 2017

(65) Prior Publication Data

US 2018/0174548 A1 Jun. 21, 2018

(30) Foreign Application Priority Data

Dec. 15, 2016 (CN) .................... 2016 2 1378790 U

(51) Int. Cl.
| | |
|---|---|
| G11C 19/00 | (2006.01) |
| G09G 5/00 | (2006.01) |
| G11C 19/28 | (2006.01) |
| G11C 19/18 | (2006.01) |
| G09G 3/20 | (2006.01) |
| G09G 3/36 | (2006.01) |

(52) U.S. Cl.
CPC .............. *G09G 5/003* (2013.01); *G09G 3/20* (2013.01); *G11C 19/184* (2013.01); *G11C 19/28* (2013.01); *G09G 3/3677* (2013.01); *G09G 2300/0408* (2013.01); *G09G 2300/0426* (2013.01); *G09G 2300/08* (2013.01); *G09G 2310/0267* (2013.01); *G09G 2310/0283* (2013.01); *G09G 2310/0286* (2013.01); *G09G 2330/023* (2013.01)

(58) Field of Classification Search
None
See application file for complete search history.

(56) References Cited

U.S. PATENT DOCUMENTS

| | | | | |
|---|---|---|---|---|
| 2013/0156148 | A1* | 6/2013 | Sasaki ................. | G11C 19/184 377/64 |
| 2015/0179277 | A1* | 6/2015 | Pai ........................... | G09G 3/20 377/68 |
| 2017/0270881 | A1* | 9/2017 | Li ........................ | G09G 3/3677 |
| 2017/0301303 | A1* | 10/2017 | Li ............................ | G09G 3/36 |
| 2018/0114498 | A1* | 4/2018 | Li ........................ | G09G 3/3677 |
| 2018/0137831 | A1* | 5/2018 | Murakami .............. | G09G 3/20 |
| 2018/0315389 | A1* | 11/2018 | Hong ................... | G09G 3/3677 |

* cited by examiner

*Primary Examiner* — Tuan T Lam
(74) *Attorney, Agent, or Firm* — Dilworth & Barrese, LLP.; Michael J. Musella, Esq.

(57) ABSTRACT

A shift register, a gate driving circuit and a display panel. The shift register includes an input circuit, an output circuit, a storage circuit, an output pull-down circuit, a pull-up circuit of a pull-down node, a pull-down circuit of the pull-down node, and a first pull-down circuit of a pull-up node. The first pull-down circuit of the pull-up node includes a resistor, and the resistor is configured to prevent a short circuit between a first power supply end and a second power supply end.

20 Claims, 6 Drawing Sheets

SHIFT REGISTER, GATE DRIVING CIRCUIT AND DISPLAY PANEL

TECHNICAL FIELD

Embodiments of the present disclosure relate to a shift register, a gate driving circuit and a display panel.

BACKGROUND

With rapid development of display technologies, display panels are developed more and more towards trends of high integration and low cost. A Gate-driver on Array (GOA) technology is to integrate a gate driving circuit on an array substrate of a display device directly by a photolithography process. A GOA circuit usually includes multiple cascaded shift registers, and each shift register corresponds to a gate line corresponding to one row of pixels (for example, each shift register provides a scan driving signal for a gate line corresponding to one row of pixels) to achieve scan driving on the display panel. Such an integration technology can save a bonding region of an Integrated Circuit (IC) and a space of a fan-out region. Therefore, a narrow frame of the display panel is achieved, and meanwhile, a product cost is reduced and a product yield rate is improved.

SUMMARY

Embodiments of the disclosure provide a shift register, comprising: an input circuit, connected to a pull-up node and configured to write a first input signal or a second input signal into the pull-up node; an output circuit, connected to the pull-up node and an output end respectively and configured to write a first clock signal into the output end when a voltage of the pull-up node meets an output condition; a storage circuit, connected to the pull-up node and the output end respectively; an output pull-down circuit, connected to the pull-down node and the output end respectively and configured to write a first power supply voltage into the output end when a voltage of the pull-down node meets a pull-down condition of the output end; a pull-up circuit of the pull-down node, connected to the pull-down node and configured to write a second power supply voltage into the pull-down node in response to a second clock signal; a pull-down circuit of the pull-down node, connected to the pull-down node and configured to write the first power supply voltage into the pull-down node when the voltage of the pull-up node meets the output condition; and a first pull-down circuit of the pull-up node, connected to the pull-up node, a first power supply end and a second power supply end respectively. The first pull-down circuit of the pull-up node includes a resistor, and the resistor is configured to prevent a short circuit between the first power supply end and the second power supply end.

For example, in the shift register provided by embodiments of the disclosure, the first pull-down circuit of the pull-up node further includes a first capacitor, a first end of the first capacitor is connected to the resistor through a first node, and a second end of the first capacitor is connected to the first power supply end to receive the first power supply voltage.

For example, in the shift register provided by embodiments of the disclosure, the first pull-down circuit of the pull-up node further includes a first transistor, a second transistor and a third transistor. A first electrode of the first transistor is connected to the second power supply end to receive the second power supply voltage, a gate electrode of the first transistor is connected to a second clock signal end to receive the second clock signal, and a second electrode of the first transistor is connected to a first end of the resistor; a second end of the resistor is connected to the first node; a first electrode of the second transistor is connected to the first node, a gate electrode of the second transistor is connected to the input circuit, and a second electrode of the second transistor is connected to the first power supply end to receive the first power supply voltage; and a first electrode of the third transistor is connected to the pull-up node, a gate electrode of the third transistor is connected to the first node, and a second electrode of the third transistor is connected to the first power supply end to receive the first power supply voltage.

For example, in the shift register provided by embodiments of the disclosure, the input circuit includes a fourth transistor, a fifth transistor and a sixth transistor. A first electrode of the fourth transistor is connected to a first input end to receive the first input signal, a gate electrode of the fourth transistor is connected to a first control signal end to receive a first control signal, and a second electrode of the fourth transistor is connected to a second node; a first electrode of the fifth transistor is connected to the second node, a gate electrode of the fifth transistor is connected to a second control signal end to receive a second control signal and a second electrode of the fifth transistor is connected to a second input end to receive the second input signal; and a first electrode of the sixth transistor is connected to the first input end to receive the first input signal, a gate electrode of the sixth transistor is connected to the second node, and a second electrode of the sixth transistor is connected to the pull-up node.

For example, in the shift register provided by embodiments of the disclosure, the output circuit includes a seventh transistor, a first electrode of the seventh transistor is connected to the first clock signal end to receive the first clock signal, a gate electrode of the seventh transistor is connected to the pull-up node, and a second electrode of the seventh transistor is connected to the output end.

For example, in the shift register provided by embodiments of the disclosure, the storage circuit includes a second capacitor, a first end of the second capacitor is connected to the pull-up node, and a second end of the second capacitor is connected to the output end.

For example, in the shift register provided by embodiments of the disclosure, the output pull-down circuit includes an eighth transistor, a first electrode of the eighth transistor is connected to the output end, a gate electrode of the eighth transistor is connected to the pull-down node, and a second electrode of the eighth transistor is connected to the first power supply end to receive the first power supply voltage.

For example, in the shift register provided by embodiments of the disclosure, the pull-up circuit of the pull-down node includes a ninth transistor, a first electrode of the ninth transistor is connected to the pull-down node, a gate electrode of the ninth transistor is connected to the second clock signal end to receive the second clock signal, and a second electrode of the ninth transistor is connected to the second power supply end to receive the second power supply voltage.

For example, in the shift register provided by embodiments of the disclosure, the pull-down circuit of the pull-down node includes a tenth transistor, a first electrode of the tenth transistor is connected to the pull-down node, a gate electrode of the tenth transistor is connected to the pull-up node, and a second electrode of the tenth transistor is connected to the first power supply end to receive the first power supply voltage.

For example, the shift register provided by embodiments of the disclosure further comprises a second pull-down circuit of the pull-up node, which is connected to the pull-up node and the pull-down node respectively and configured to write the first power supply voltage into the pull-up node when the voltage of the pull-down node meets the pull-down condition of the output end.

For example, in the shift register provided by embodiments of the disclosure, the second pull-down circuit of the pull-up node includes an eleventh transistor, a first electrode of the eleventh transistor is connected to the pull-up node, a gate electrode of the eleventh transistor is connected to the pull-down node and a second electrode of the eleventh transistor is connected to the first power supply end to receive the first power supply voltage.

For example, the shift register provided by embodiments of the disclosure further comprises a third pull-down circuit of the pull-up node which includes a twelfth transistor, wherein a first electrode of the twelfth transistor is connected to the pull-up node, a gate electrode of the twelfth transistor is connected to the pull-down node, and a second electrode of the twelfth transistor is connected to the first power supply end to receive the first power supply voltage.

For example, the shift register provided by embodiments of the disclosure further comprises a thirteenth transistor, wherein the input circuit is connected to the pull-up node through the thirteenth transistor, and a gate electrode of the thirteenth transistor is connected to the second power supply end to receive the second power supply voltage.

Embodiments of the disclosure further provide a gate driving circuit, comprising the shift register described above.

Embodiments of the disclosure further provide a display panel, comprising the gate driving circuit described above.

BRIEF DESCRIPTION OF THE DRAWINGS

In order to illustrate the technical solutions in the embodiments of the present disclosure more clearly, the drawings needed to be used in the description of the embodiments will be briefly described in the following. It is obvious that the drawings described below are only related to some embodiments of the present disclosure, and are not intended to be limitative to the disclosure.

DETAILED DESCRIPTION

Figure 1:
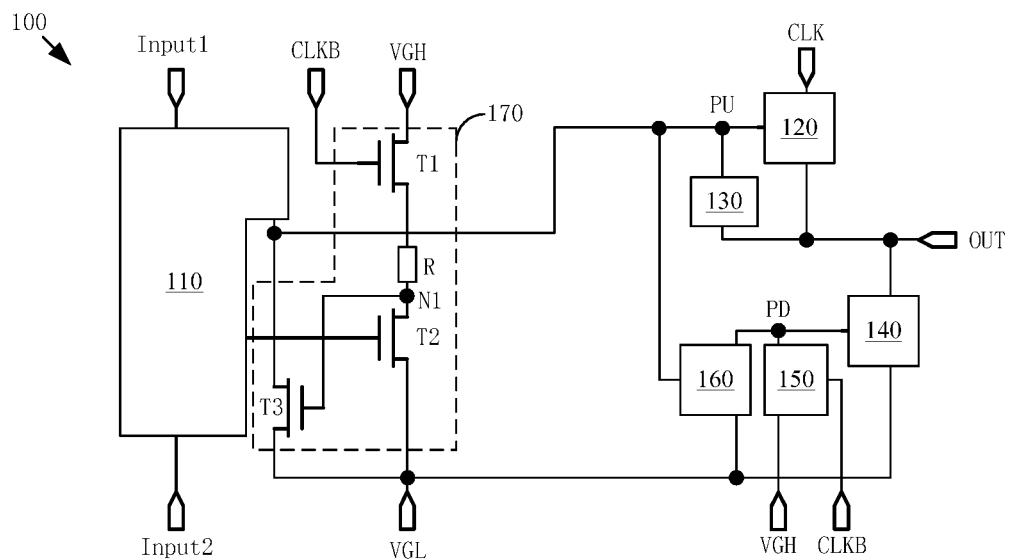
FIG. 1 is a first schematic diagram of a shift register provided by an embodiment of the present disclosure.

Hereinafter, the technical solutions of the embodiments of the present disclosure will be described in a clearly and fully understandable way in conjunction with the drawings related to the embodiments of the present disclosure; with reference to non-restrictive exemplary embodiments shown in the drawings and described in detail in the following description, exemplary embodiments of the present disclosure and their various features and favorable details are illustrated more comprehensively. It should be noted that, the features shown in the drawings are not necessarily drawn according to scale. Known materials, components and process technologies are not described in the present disclosure so as not to obscure the exemplary embodiments of the present disclosure. Examples given are merely intended to facilitate understanding of implementation of exemplary embodiments of the present disclosure, and further enable those skilled in the art to implement the exemplary embodiments. Therefore, the examples should not be construed as limiting the scope of the exemplary embodiments of the present disclosure.

Unless otherwise defined, technical terms or scientific terms used in the present disclosure should be of general meaning as understood by those ordinarily skilled in the art. "First", "second" and similar words used in the present disclosure do not represent any sequence, quantity or importance and merely intend to differentiate different composite parts. In addition, in respective embodiments of the present disclosure, same or similar reference signs denote same or similar parts.

When more and more static charges are accumulated in a shift register, a failure of related circuit units may occur, and further failure of operation of a whole gate driving circuit may occur, which affects a yield rate of display panels. When thin film transistors in the shift register have a relatively large leakage current or are turned on by error, a short circuit may be caused between a high voltage power supply and a low voltage power supply, thereby resulting in an increase of power consumption or even faults of the panel.

Embodiments of the present disclosure provide a shift register, a gate driving circuit and a display panel; by configuring resistors and/or capacitors in the shift register, the work failure of the circuit caused by electrostatic damage of the shift register can be effectively prevented; and meanwhile, the increase of power consumption or faults of the display panel caused by the short circuit between the high voltage power supply and the low voltage power supply can be prevented.

For example, an embodiment of the present disclosure provides a shift register 100; as shown in FIG. 1, the shift register 100 comprises an input circuit 110, an output circuit 120, a storage circuit 130, an output pull-down circuit 140, a pull-up circuit 150 of a pull-down node, a pull-down circuit 160 of the pull-down node, and a first pull-down circuit 170 of a pull-up node. The input circuit 110 is connected to the pull-up node PU and configured to write a first input signal Input1 or a second input signal Input2 into the pull-up node PU; the output circuit 120 is respectively connected to the pull-up node PU and an output end OUT, and configured to write a first clock signal CLK into the output end OUT when a voltage of the pull-up node PU meets an output condition; the storage circuit 130 is respectively connected to the pull-up node PU and the output end OUT; the output pull-down circuit 140 is respectively connected to the pull-down node PD and the output end OUT, and configured to write a first power supply voltage VGL into the output end OUT when a voltage of the pull-down node PD meets a pull-down condition of the output end OUT; the pull-up circuit 150 of the pull-down node is connected to the pull-down node PD, and configured to write a second power supply voltage VGH into the pull-down node PD in response to a second clock signal CLKB; the pull-down circuit 160 of the pull-down node is connected to the pull-down node PD, and configured to write the first power supply voltage VGL into the pull-down node PD when the voltage of the pull-up node PU meets the output condition; and the first pull-down circuit 170 of the pull-up node is respectively connected to the pull-up node PU, a first power supply end (a power supply end providing the first power supply voltage VGL) and a second power supply end (a power supply end providing the second power supply voltage VGH), the first pull-down circuit 170 of the pull-up node includes a resistor R, and the resistor R is configured to prevent a short circuit between the first power supply end and the second power supply end.

For example, the first power supply voltage VGL can be a low-level voltage (for example, 0V, −5V, −10V or other suitable values) and the second power supply voltage VGH can be a high-level voltage (for example, 5V, 10V, or other suitable values).

For example, in the shift register 100 provided by an embodiment of the present disclosure, as shown in FIG. 1, the first pull-down circuit 170 of the pull-up node further includes a first transistor T1, a second transistor T2 and a third transistor T3. A first electrode of the first transistor T1 is connected to the second power supply end to receive the second power supply voltage VGH, a gate electrode of the first transistor T1 is connected to a second clock signal end to receive the second clock signal CLKB, and a second electrode of the first transistor T1 is connected to a first end of the resistor R; a second end of the resistor R is connected to a first node N1; a first electrode of the second transistor T2 is connected to the first node N1, a gate electrode of the second transistor T2 is connected to the input circuit 110, and a second electrode of the second transistor T2 is connected to the first power supply end to receive the first power supply voltage VGL; and a first electrode of the third transistor T3 is connected to the pull-up node PU, a gate electrode of the third transistor T3 is connected to the first node N1, and a second electrode of the third transistor T3 is connected to the first power supply end to receive the first power supply voltage VGL.

For example, if the first transistor T1 and the second transistor T2 have a relatively large leakage current or are turned on by error, a short circuit may possible occur between the first power supply end and the second power supply end (i.e., the high voltage power supply and the low voltage power supply), and then as a result, increase of power consumption or even faults of a display panel may be incurred. Therefore, the resistor R is configured between the first transistor T1 and the second transistor T2 to reduce or avoid influences caused by the above problem.

For example, if the second transistor T2 still has a large leakage current under a turn-off state, the short circuit is caused between the first power supply end and the second power supply end under a turn-on state of the first transistor T1, and as a result, increase of circuit power consumption or even faults may be incurred. The resistor R is configured between the first transistor T1 and the second transistor T2 to avoid the short circuit between the first power supply end and the second power supply end.

Figure 2:
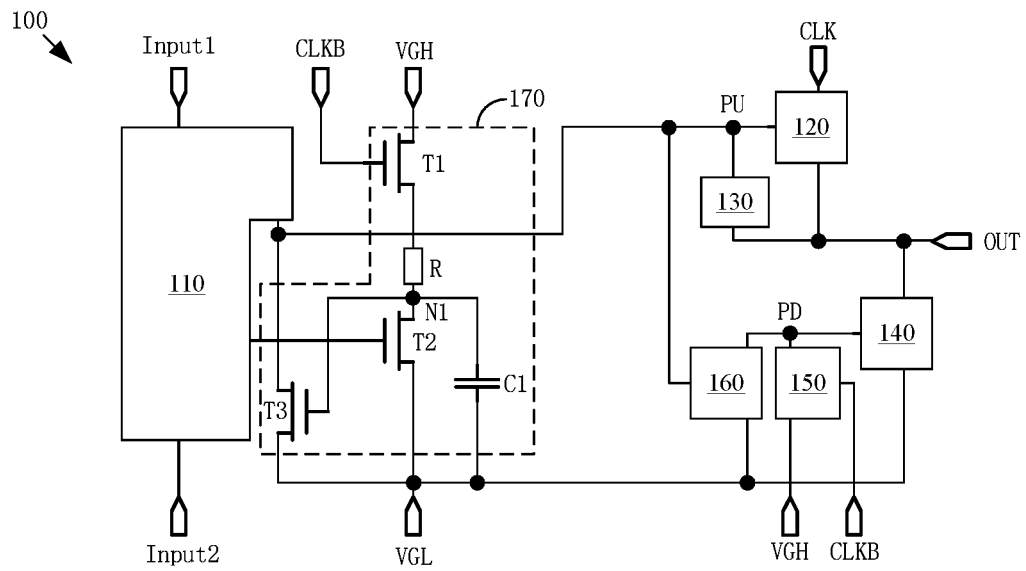
FIG. 2 is a second schematic diagram of the shift register provided by an embodiment of the present disclosure.

For example, in the shift register 100 provided by an embodiment of the present disclosure, as shown in FIG. 2, the first pull-down circuit 170 of the pull-up node further includes a first capacitor C1. A first end of the first capacitor C1 is connected to the resistor R through the first node N1, and a second end of the first capacitor C1 is connected to the first power supply end to receive the first power supply voltage VGL.

For example, in a working process of the shift register, when relatively large static charges are accumulated on the second power supply end having a high-level voltage, abnormality of a voltage of the pull-up node PU, abnormality of a voltage of the pull-down node PD and abnormality of an output signal of the output end may be caused possibly, and further a failure of the gate driving circuit may be caused. The first capacitor C1 is configured to absorb the charges accumulated in the circuit (for example, the static charges accumulated on the second power supply end having the high-level voltage). Then, a circuit failure caused by electrostatic damage that may occur in the shift register can be effectively prevented.

Figure 3:
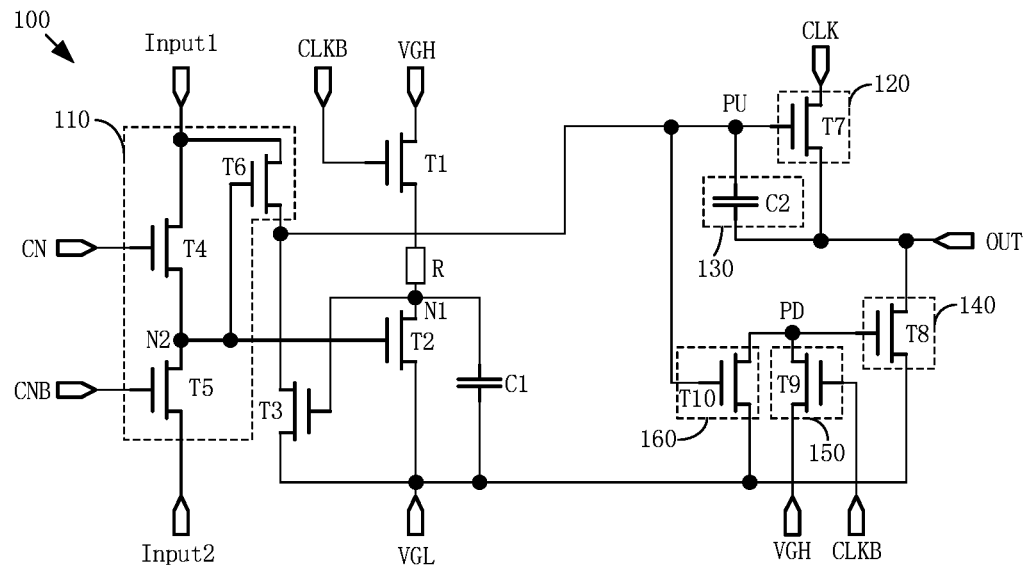
FIG. 3 is a third schematic diagram of the shift register provided by an embodiment of the present disclosure.

For example, in the shift register 100 provided by an embodiment of the present disclosure, as shown in FIG. 3, the input circuit 110 includes a fourth transistor T4, a fifth transistor T5 and a sixth transistor T6. A first electrode of the fourth transistor T4 is connected to a first input end to receive the first input signal Input1, a gate electrode of the fourth transistor T4 is connected to a first control signal end to receive a first control signal CN, and a second electrode of the fourth transistor T4 is connected to a second node N2; a first electrode of the fifth transistor T5 is connected to the second node N2, a gate electrode of the fifth transistor T5 is connected to a second control signal end to receive a second control signal CNB, and a second electrode of the fifth transistor T5 is connected to a second input end to receive the second input signal Input2; and a first electrode of the sixth transistor T6 is connected to the first input end to receive the first input signal Input1, a gate electrode of the sixth transistor T6 is connected to the second node N2, and a second electrode of the sixth transistor T6 is connected to the pull-up node PU.

For example, the input circuit 110 can achieve a two-way scanning of the shift register, and a working principle thereof is introduced below.

For example, during a forward scanning, the first control signal CN is a high-level signal (for example, 5V, 10V, 15V or other values), and the second control signal CNB is a low-level signal (for example, 0V, −5V, −10V or other values); during a reverse scanning, the first control signal CN is a low-level signal (for example, 0V −5V, −10V or other values), and the second control signal CNB is a high-level signal (for example, 5V, 10V, 15V or other values). The first control signal CN is used for controlling turning on and turning off the fourth transistor T4. The second control signal CNB is used for controlling turning on and turning off the fifth transistor T5.

For example, in the shift register 100 provided by an embodiment of the present disclosure, as shown in FIG. 3, the output circuit 120 includes a seventh transistor T7. A first electrode of the seventh transistor T7 is connected to the first clock signal end to receive the first clock signal CLK, a gate electrode of the seventh transistor T7 is connected to the pull-up node PU, and a second electrode of the seventh transistor T7 is connected to the output end OUT.

For example, in the shift register 100 provided by an embodiment of the present disclosure, as shown in FIG. 3, the storage circuit 130 includes a second capacitor C2. A first end of the second capacitor C2 is connected to the pull-up node PU, and a second end of the second capacitor C2 is connected to the output end OUT.

For example, in the shift register 100 provided by an embodiment of the present disclosure, as shown in FIG. 3, the output pull-down circuit 140 includes an eighth transistor T8. A first electrode of the eighth transistor T8 is connected to the output end OUT, a gate electrode of the eighth transistor T8 is connected to the pull-down node PD, and a second electrode of the eighth transistor T8 is connected to the first power supply end to receive the first power supply voltage VGL.

For example, in the shift register 100 provided by an embodiment of the present disclosure, as shown in FIG. 3, the pull-up circuit 150 of the pull-down node includes a ninth transistor T9. A first electrode of the ninth transistor T9 is connected to the pull-down node PD, a gate electrode of the ninth transistor T9 is connected to the second clock signal end to receive the second clock signal CLKB, and a second electrode of the ninth transistor T9 is connected to the second power supply end to receive the second power supply voltage VGH.

For example, in the shift register 100 provided by an embodiment of the present disclosure, as shown in FIG. 3, the pull-down circuit 160 of the pull-down node includes a tenth transistor T10. A first electrode of the tenth transistor T10 is connected to the pull-down node PD, a gate electrode of the tenth transistor T10 is connected to the pull-up node PU, and a second electrode of the tenth transistor T10 is connected to the first power supply end to receive the first power supply voltage VGL.

Figure 4:
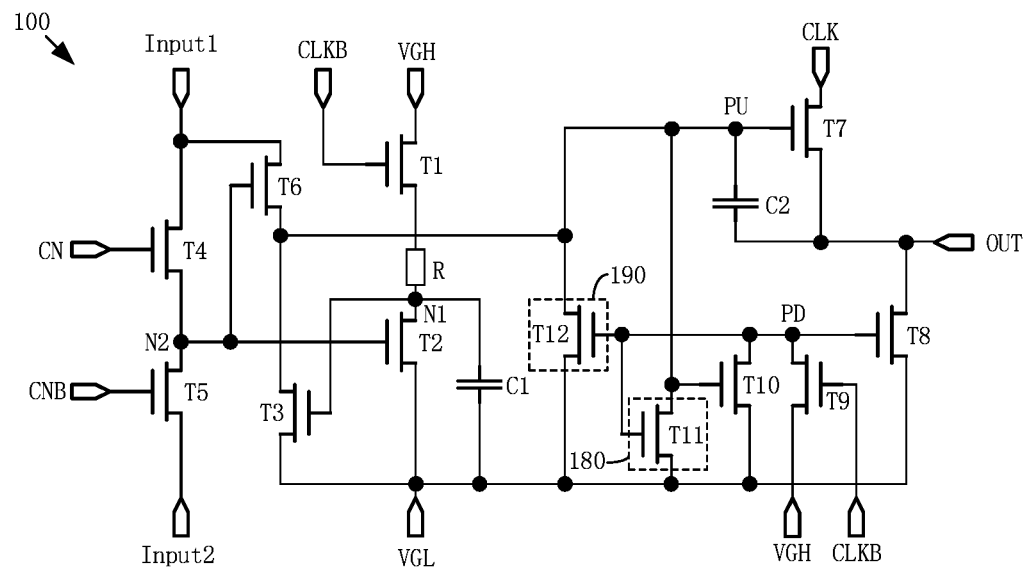
FIG. 4 is a fourth schematic diagram of the shift register provided by an embodiment of the present disclosure.

For example, as shown in FIG. 4, the shift register 100 provided by an embodiment of the present disclosure further comprises a second pull-down circuit 180 of the pull-up node. The second pull-down circuit 180 of the pull-up node is respectively connected to the pull-up node PU and the pull-down node PD, and configured to write the first power supply voltage VGL into the pull-up node PU when the voltage of the pull-down node PD meets the pull-down condition of the output end OUT.

For example, in the shift register 100 provided by an embodiment of the present disclosure, as shown in FIG. 4, the second pull-down circuit 180 of the pull-up node includes an eleventh transistor T11. A first electrode of the eleventh transistor T11 is connected to the pull-up node PU, a gate electrode of the eleventh transistor T11 is connected to the pull-down node PD and a second electrode of the eleventh transistor T11 is connected to the first power supply end to receive the first power supply voltage VGL.

For example, the second pull-down circuit 180 of the pull-up node can cooperate with the first pull-down circuit 170 of the pull-up node to accelerate a pull-down process of the pull-up node.

For example, as shown in FIG. 4, the shift register 100 provided by an embodiment of the present disclosure further comprises a third pull-down circuit 190 of the pull-up node. The third pull-down circuit 190 of the pull-up node includes a twelfth transistor T12. A first electrode of the twelfth transistor T12 is connected to the pull-up node PU, a gate electrode of the twelfth transistor T12 is connected to the pull-down node PD, and a second electrode of the twelfth transistor T12 is connected to the first power supply end to receive the first power supply voltage VGL.

For example, the third pull-down circuit 190 of the pull-up node can cooperate with the first pull-down circuit 170 of the pull-up node and the second pull-down circuit 180 of the pull-up node to accelerate a pull-down process of the pull-up node.

Figure 5:
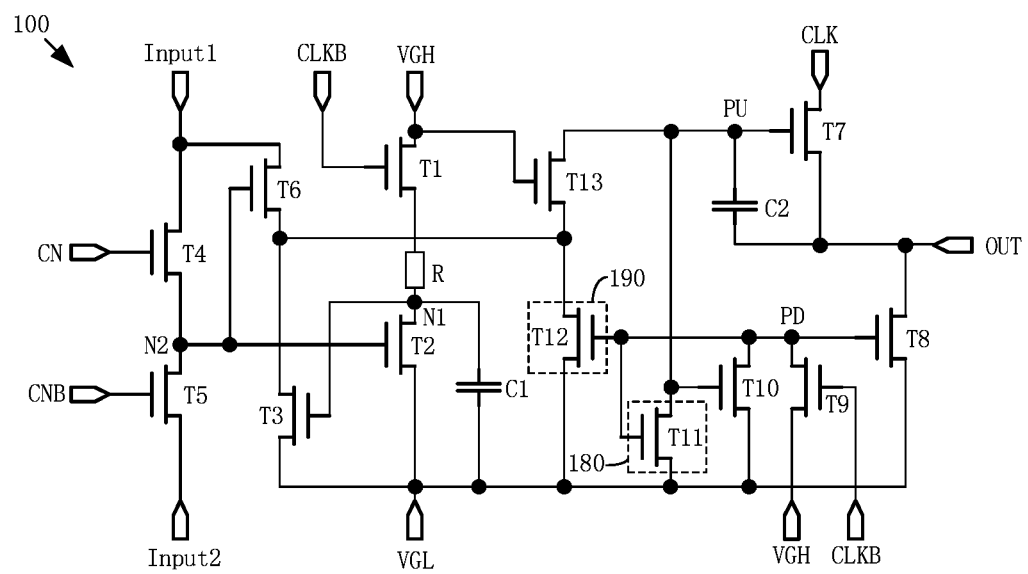
FIG. 5 is a fifth schematic diagram of the shift register provided by an embodiment of the present disclosure.

For example, as shown in FIG. 5, the shift register 100 provided by an embodiment of the present disclosure further comprises a thirteenth transistor T13. The input circuit 110 is connected to the pull-up node PU through the thirteenth transistor T13, and a gate electrode of the thirteenth transistor T13 is connected to the second power supply end to receive the second power supply voltage VGH.

For example, as shown in FIG. 5, a first electrode of the thirteenth transistor T13 is connected to the pull-up node PU; and a second electrode of the thirteenth transistor, the second electrode of the sixth transistor T6 and the first electrode of the twelfth transistor T12 are connected together. That is, the second electrode of the sixth transistor T6 can be connected to the pull-up node PU through the thirteenth transistor T13, and the first electrode of the twelfth transistor T12 can be connected to the pull-up node PU through the thirteenth transistor T13.

For example, the thirteenth transistor T13 can improve stability of the shift register.

It should be noted that the transistors adopted in the embodiments of the present disclosure can be thin film transistors or field effect transistors or other switching devices with the same characteristics. Source electrodes and drain electrodes of the transistors adopted here can be structurally symmetric, so that the source electrodes and the drain electrodes can have no difference in structure. In the embodiments of the present disclosure, in order to differentiate the two electrodes of a transistor except for the gate electrode, one electrode is directly described as a first electrode and the other electrode is directly described as a second electrode. Thus, the first electrodes and second electrodes of all or part of the transistors in the embodiments of the present disclosure are interchangeable according to actual needs. For example, the first electrodes of the transistors mentioned in the embodiments of the present disclosure are source electrodes while the second electrodes are drain electrodes; or, the first electrodes of the transistors are drain electrodes and the second electrodes are source electrodes. In addition, if distinguished according to characteristics of the transistors, the transistors can be divided into N-type transistors and P-type transistors. When the transistors are the P-type transistors, a turn-on voltage is a low-level voltage (for example, 0V, −5V, −10V, or other values), and a turn-off voltage is a high-level voltage (for example, 5V, 10V, 15V or other values); and when the transistors are the N-type transistors, a turn-on voltage is a high-level voltage (for example, 5V, 10V, 15V or other values), and a turn-off voltage is a low-level voltage (for example, 0V, −5V, −10V, or other values). The embodiments of the present disclosure take respective transistors (including the first transistor T1, the second transistor T2, the third transistor T3, the fourth transistor T4, the fifth transistor T5, the sixth transistor T6, the seventh transistor T7, the eighth transistor T8, the ninth transistor T9, the tenth transistor T10, the eleventh transistor T11, the twelfth transistor T12 and the thirteenth transistor T13) which are N-type transistors as examples for explanation. Based on the description and teaching on implementations of the present disclosure, those ordinary skilled in the art can easily conceive embodiments of the present disclosure that adopt implementations of the P-type transistors or combination of the N-type and P-type transistors under the premise of not making any creative labor. Therefore, these implementations all fall within a protection scope of the present disclosure.

Figure 6:
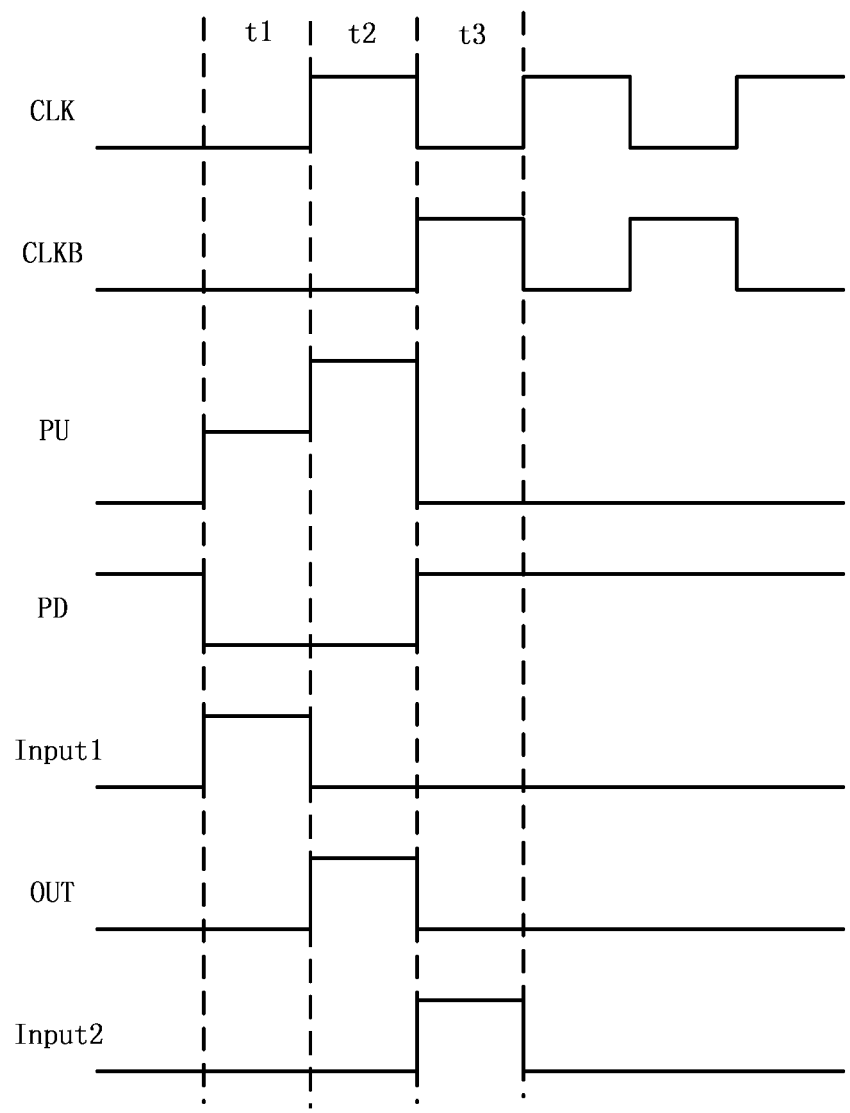
FIG. 6 is a driving timing diagram of a shift register provided by an embodiment of the present disclosure.

For example, FIG. 6 is a driving timing diagram during a forward scanning of a shift register provided by an embodiment of the present disclosure. Next, the forward scanning is taken as an example for illustratively explain a working principle of the shift register 100 as shown in FIG. 5 in combination with the driving timing diagram as shown in FIG. 6.

For example, during the forward scanning, the first control signal CN is of a high-level voltage, and the fourth transistor T4 is turned on; and the second control signal CNB is of a low-level voltage and the fifth transistor T5 is turned off.

For example, as shown in FIGS. 5 and 6, in a first stage t1 of the forward scanning, the first clock signal CLK is of the low-level voltage, the second clock signal CLKB is of the low-level voltage, the first input signal Input1 is of the high-level voltage and the second input signal Input2 is of the low-level voltage. The fourth transistor T4, the sixth transistor T6 and the thirteenth transistor T13 are turned on, the high-level voltage is written into the pull-up node PU from the first input end, the second capacitor C2 is charged, the seventh transistor T7 is turned on, the low-level voltage of the first clock signal CLK is written into the output end OUT, the tenth transistor T10 is turned on, and the low-level first power supply voltage VGL is written into the pull-down PD node by the tenth transistor. That is, the output condition met by the voltage of the pull-up node PU is: the voltage of the pull-up node PU is a voltage capable of conducting the first clock signal end with the output end OUT (for example, a high-level voltage capable of turning on the seventh transistor T7, so that the first clock signal end CLK is electrically connected with the output end OUT through the switched-on seventh transistor T7).

For example, as shown in FIGS. 5 and 6, in a second stage t2 of the forward scanning, the first clock signal CLK is of the high-level voltage, the second clock signal CLKB is of the low-level voltage, the first input signal Input1 is of the low-level voltage and the second input signal Input2 is of the low-level voltage. Because of a bootstrap function of the second capacitor C2, the voltage of the pull-up node PU continues to increase, the seventh transistor T7 is turned on more sufficiently, and the high-level voltage of the first clock signal CLK is written into the output end OUT. In this stage, the tenth transistor T10 continues to be turned on, and the pull-down node PD keeps the low-level voltage.

For example, as shown in FIGS. 5 and 6, in a third stage t3 of the forward scanning, the first clock signal CLK is of the low-level voltage, the second clock signal CLKB is of the high-level voltage, the first input signal Input1 is of the low-level voltage and the second input signal Input2 is of the high-level voltage. The first transistor T1 and the ninth transistor T9 are turned on, the first node N1 is turned into the high-level voltage, the third transistor T3 and the thirteenth transistor T13 are turned on, the low-level first power supply voltage VGL is written into the pull-up node PU through the third transistor T3 and the thirteenth transistor T13, the high-level second power supply voltage VGH is written into the pull-down node PD by the ninth transistor T9, the eighth transistor T8 is turned on, the low-level first power supply voltage VGL is written into the output end OUT by the eighth transistor T8, and the eleventh transistor T11 and the twelfth transistor T12 are turned on and cooperate with the third transistor T3 to pull down the voltage of the PU node together. That is, the pull-down condition of the output end OUT is that, for example, the voltage of the pull-down node PD is a voltage capable of conducting the first power supply end with the output end OUT (for example, the voltage of the pull-down node PD becomes a high-level voltage capable of turning on the eighth transistor T8, so that the first power supply end is electrically connected to the output end OUT through the switched-on eighth transistor T8).

For example, during a reverse scanning, the first control signal CN is of the low-level voltage, and the fourth transistor T4 is turned off; and the second control signal CNB is of the high-level voltage and the fifth transistor T5 is turned on. That is, timing sequences of the first input end Input1 and the second input end Input2 are exchanged, and a working process of the reverse scanning is similar to that of the forward scanning and is not repeated here.

It should be noted that the shift registers 100 as shown in FIGS. 1-5 are merely some examples in the embodiments of the present disclosure, and the embodiments of the present disclosure include, but are not limited to, these examples.

Figure 7:
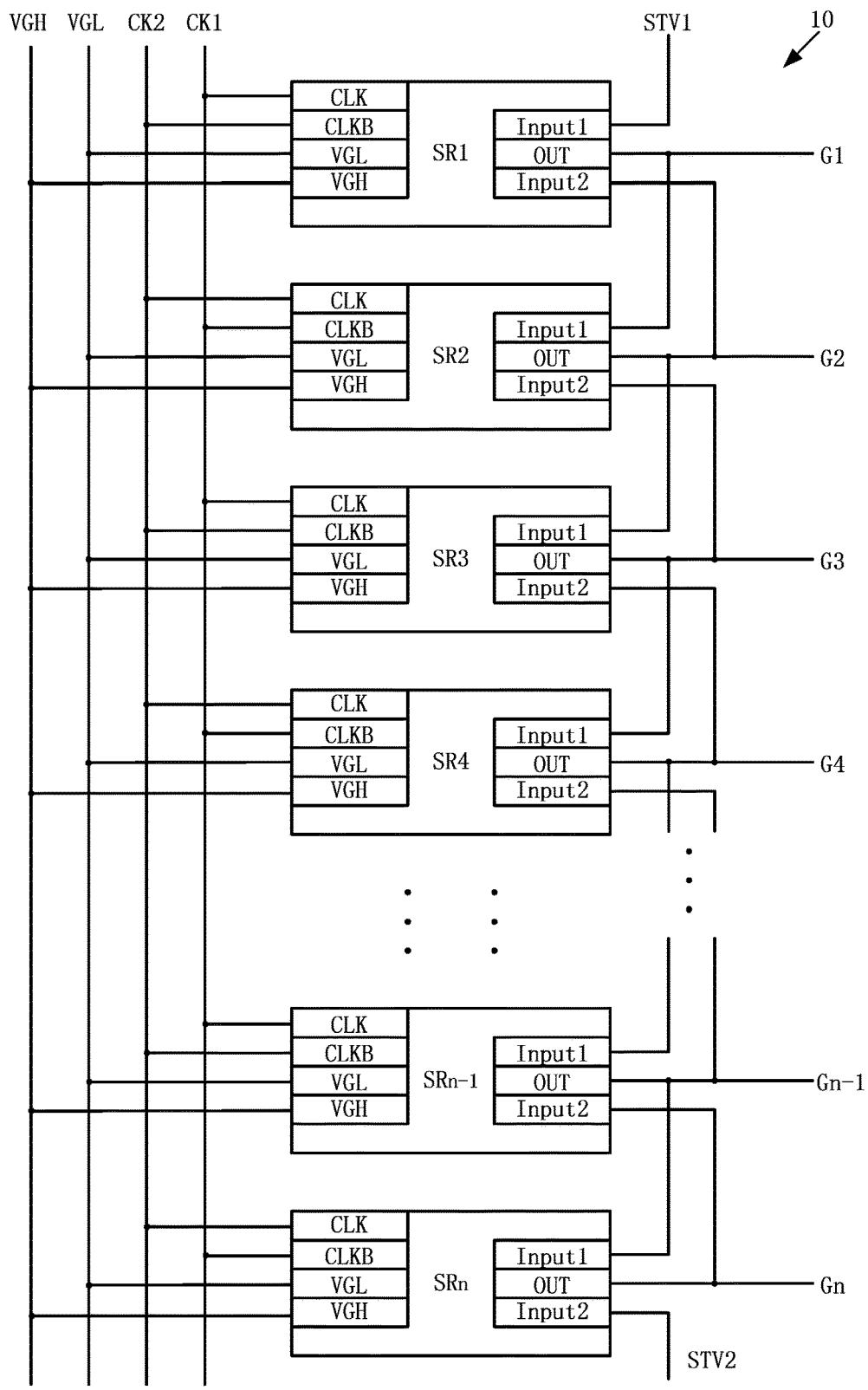
FIG. 7 is a schematic diagram of a gate driving circuit provided by an embodiment of the present disclosure.

For example, as shown in FIG. 7, an embodiment of the present disclosure further provides a gate driving circuit 10, comprising a shift register 100 provided by any one embodiment of the present disclosure.

For example, as shown in FIG. 7, the gate driving circuit 10 provided by an embodiment of the present disclosure comprises a plurality of (for example, n) cascaded shift registers 100 provided by any one embodiment of the present disclosure. For example, n is a positive integer. Except for a shift register 100 of a first stage and a shift register 100 of a last stage, a first input end of a shift register 100 of a present stage is connected to an output end OUT of a shift register 100 of a previous stage; and a second input end of the shift register 100 of the present stage is connected to an output end OUT of a shift register 100 of a next stage. For example, the first input end of the shift register of the first stage is connected to a first trigger signal end to receive a first trigger signal STV1; and the second input end of the shift register of the last stage is connected to a second trigger signal end to receive a second trigger signal STV2.

For example, the first trigger signal STV1 can serve as a trigger signal during the forward scanning, and the second trigger signal STV2 can serve as a trigger signal during the reverse scanning For example, the gate driving circuit 10 comprises n stages of shift registers SR1, SR2, . . . , SRn, and these shift registers SR1, SR2, . . . , SRn can be the shift registers 100 provided by any one embodiment of the present disclosure. The output ends of the shift registers SR1, SR2, . . . , SRn are correspondingly connected to gate lines G1, G2, . . . , Gn.

It should be noted that because the gate driving circuit 10 provided by embodiments of the present disclosure can achieve the forward scanning and the reverse scanning, during switching of a scanning direction, a "previous stage" and a "next stage" in time sequence will be correspondingly changed. Therefore, the "previous stage" and "next stage" mentioned above refer to the previous stage and next stage in physical connection instead of the previous stage and next stage in scanning time sequence.

For example, as shown in FIG. 7, the gate driving circuit 10 further comprises a first clock source CK1 and a second clock source CK2, which are used for providing clock signals needed by the shift registers. The first clock signal ends of the shift registers of odd-numbered stages are connected to the first clock source CK1, and the second clock signal ends of the shift registers of odd-numbered stages are connected to the second clock source CK2; and the first clock signal ends of shift registers of even-numbered stages are connected to the second clock source CK2, and the second clock signal ends of the shift registers of even-numbered stages are connected to the first clock source CK1.

For example, as shown in FIG. 7, the gate driving circuit 10 further comprises a low-level power supply for providing the first power supply voltage VGL and a high-level power supply for providing the second power supply voltage VGH, and the low-level power supply and the high-level power supply are connected to each stage of shift register. For example, the first control signal CN and the second control signal CNB can be implemented by using the low-level power supply and the high-level power supply according to actual needs of the forward scanning or reverse scanning. Or, signal sources for providing the first control signal CN and the second control signal CNB can be set separately, which is not limited by the embodiments of the present disclosure.

It should be noted that the gate driving circuit provided by embodiments of the present disclosure comprises, but is not limited to, the scenario as shown in FIG. 7, and other gate driving circuits comprising the shift registers provided by the embodiments of the present disclosure all fall within a scope of the embodiments of the present disclosure.

Figure 8:
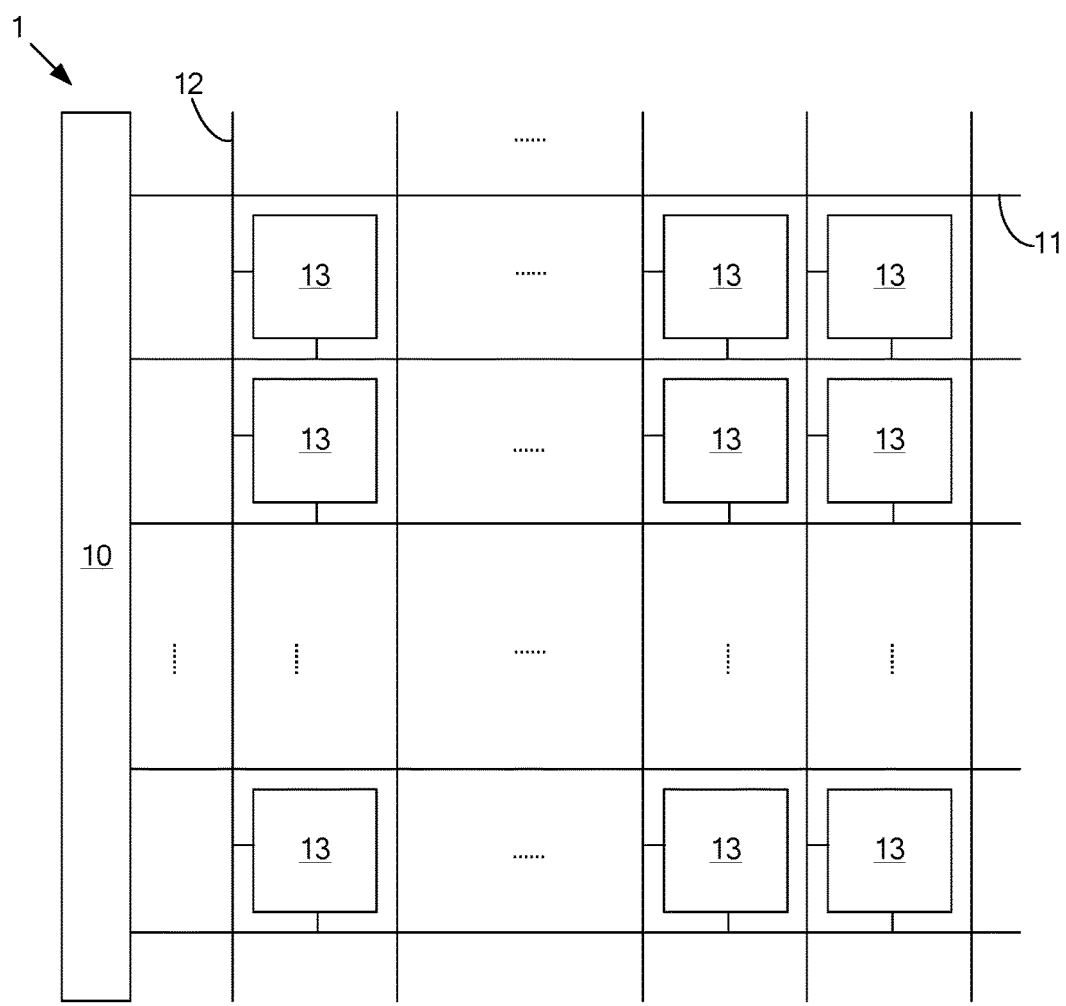
FIG. 8 is a schematic diagram of a display panel provided by an embodiment of the present disclosure.

For example, as shown in FIG. 8, an embodiment of the present disclosure further provides a display panel 1, and the display panel 1 comprises the gate driving circuit 10 provided by any embodiment of the present disclosure.

For example, as shown in FIG. 8, the display panel 1 provided by an embodiment of the present disclosure further comprises gate lines 11, data lines 12 and a plurality of pixel units 13 defined by intersection of the gate lines 11 and the data lines 12. The gate driving circuit 10 is configured to provide gate driving signals to the gate lines 11.

For example, the gate lines 11 can include the gate lines G1, G2, . . . , Gn as shown in FIG. 5. Each stage of shift register in the shift registers SR1, SR2, . . . , SRn is used for outputting a gate driving signal for one row of pixel units to a corresponding gate line in the gate lines G1, G2, . . . , Gn.

According to the shift register, the gate driving circuit and the display panel provided by the embodiments of the present disclosure, by setting a resistor and/or a capacitor in the shift register, a work failure of the circuit caused by electrostatic damage of the shift register can be effectively prevented, and meanwhile, increase of power consumption or faults of the display panel caused by a short circuit between the high voltage power supply and the low voltage power supply can be prevented.

Although embodiments of the disclosure has been described above in great detail with general descriptions and specific embodiments, on the basis of the embodiment of the disclosure, various changes and improvements may be made, which is apparent to those skilled in the art. Therefore, all such changes and improvements without departing from the spirit of the disclosure are within the scope of the claims of the disclosure.

The present application claims the priority of the Chinese Patent Application No. 201621378790.8 filed on Dec. 15, 2016, which is incorporated herein by reference in its entirety as part of the disclosure of the present application.

The invention claimed is:

1. A shift register, comprising:
an input circuit, connected to a pull-up node and configured to write a first input signal or a second input signal into the pull-up node;
an output circuit, connected to the pull-up node and an output end respectively and configured to write a first clock signal into the output end when a voltage of the pull-up node meets an output condition;
a storage circuit, connected to the pull-up node and the output end respectively;
an output pull-down circuit, connected to a pull-down node and the output end respectively and configured to write a first power supply voltage into the output end when a voltage of the pull-down node meets a pull-down condition of the output end;
a pull-up circuit of the pull-down node, connected to the pull-down node and configured to write a second power supply voltage into the pull-down node in response to a second clock signal;
a pull-down circuit of the pull-down node, connected to the pull-down node and configured to write the first power supply voltage into the pull-down node when the voltage of the pull-up node meets the output condition; and
a first pull-down circuit of the pull-up node, connected to the pull-up node, a first power supply end and a second power supply end respectively, wherein:
the first pull-down circuit of the pull-up node includes a resistor, and the resistor is configured to prevent a short circuit between the first power supply end and the second power supply end.

2. The shift register according to claim 1, wherein the first pull-down circuit of the pull-up node further includes a first capacitor, a first end of the first capacitor is connected to the resistor through a first node, and a second end of the first capacitor is connected to the first power supply end to receive the first power supply voltage.

3. The shift register according to claim 1, wherein the first pull-down circuit of the pull-up node further includes a first transistor, a second transistor and a third transistor,
a first electrode of the first transistor is connected to the second power supply end to receive the second power supply voltage, a gate electrode of the first transistor is connected to a second clock signal end to receive the second clock signal, and a second electrode of the first transistor is connected to a first end of the resistor;
a second end of the resistor is connected to the first node;
a first electrode of the second transistor is connected to the first node, a gate electrode of the second transistor is connected to the input circuit, and a second electrode of the second transistor is connected to the first power supply end to receive the first power supply voltage; and
a first electrode of the third transistor is connected to the pull-up node, a gate electrode of the third transistor is connected to the first node, and a second electrode of the third transistor is connected to the first power supply end to receive the first power supply voltage.

4. The shift register according to claim 1, wherein the input circuit includes a fourth transistor, a fifth transistor and a sixth transistor,
a first electrode of the fourth transistor is connected to a first input end to receive the first input signal, a gate electrode of the fourth transistor is connected to a first control signal end to receive a first control signal, and a second electrode of the fourth transistor is connected to a second node;
a first electrode of the fifth transistor is connected to the second node, a gate electrode of the fifth transistor is connected to a second control signal end to receive a second control signal and a second electrode of the fifth transistor is connected to a second input end to receive the second input signal; and
a first electrode of the sixth transistor is connected to the first input end to receive the first input signal, a gate electrode of the sixth transistor is connected to the second node, and a second electrode of the sixth transistor is connected to the pull-up node.

5. The shift register according to claim 1, wherein the output circuit includes a seventh transistor, a first electrode of the seventh transistor is connected to the first clock signal end to receive the first clock signal, a gate electrode of the seventh transistor is connected to the pull-up node, and a second electrode of the seventh transistor is connected to the output end.

6. The shift register according to claim 1, wherein the storage circuit includes a second capacitor, a first end of the second capacitor is connected to the pull-up node, and a second end of the second capacitor is connected to the output end.

7. The shift register according to claim 1, wherein the output pull-down circuit includes an eighth transistor, a first electrode of the eighth transistor is connected to the output end, a gate electrode of the eighth transistor is connected to the pull-down node, and a second electrode of the eighth transistor is connected to the first power supply end to receive the first power supply voltage.

8. The shift register according to claim 1, wherein the pull-up circuit of the pull-down node includes a ninth transistor, a first electrode of the ninth transistor is connected to the pull-down node, a gate electrode of the ninth transistor is connected to the second clock signal end to receive the second clock signal, and a second electrode of the ninth transistor is connected to the second power supply end to receive the second power supply voltage.

9. The shift register according to claim 1, wherein the pull-down circuit of the pull-down node includes a tenth transistor, a first electrode of the tenth transistor is connected to the pull-down node, a gate electrode of the tenth transistor is connected to the pull-up node, and a second electrode of the tenth transistor is connected to the first power supply end to receive the first power supply voltage.

10. The shift register according to claim 1, further comprising a second pull-down circuit of the pull-up node, which is connected to the pull-up node and the pull-down node respectively and configured to write the first power supply voltage into the pull-up node when the voltage of the pull-down node meets the pull-down condition of the output end.

11. The shift register according to claim 10, wherein the second pull-down circuit of the pull-up node includes an eleventh transistor, a first electrode of the eleventh transistor is connected to the pull-up node, a gate electrode of the eleventh transistor is connected to the pull-down node and a second electrode of the eleventh transistor is connected to the first power supply end to receive the first power supply voltage.

12. The shift register according to claim 1, further comprising a third pull-down circuit of the pull-up node which includes a twelfth transistor, wherein a first electrode of the twelfth transistor is connected to the pull-up node, a gate electrode of the twelfth transistor is connected to the pull-down node, and a second electrode of the twelfth transistor is connected to the first power supply end to receive the first power supply voltage.

13. The shift register according to claim 1, further comprising a thirteenth transistor, wherein the input circuit is connected to the pull-up node through the thirteenth transistor, and a gate electrode of the thirteenth transistor is connected to the second power supply end to receive the second power supply voltage.

14. The shift register according to claim 2, wherein the input circuit includes a fourth transistor, a fifth transistor and a sixth transistor,
a first electrode of the fourth transistor is connected to a first input end to receive the first input signal, a gate electrode of the fourth transistor is connected to a first control signal end to receive a first control signal, and a second electrode of the fourth transistor is connected to a second node;
a first electrode of the fifth transistor is connected to the second node, a gate electrode of the fifth transistor is connected to a second control signal end to receive a second control signal and a second electrode of the fifth transistor is connected to a second input end to receive the second input signal; and
a first electrode of the sixth transistor is connected to the first input end to receive the first input signal, a gate electrode of the sixth transistor is connected to the second node, and a second electrode of the sixth transistor is connected to the pull-up node.

15. The shift register according to claim 2, wherein the output circuit includes a seventh transistor, a first electrode of the seventh transistor is connected to the first clock signal end to receive the first clock signal, a gate electrode of the seventh transistor is connected to the pull-up node, and a second electrode of the seventh transistor is connected to the output end.

16. The shift register according to claim 2, wherein the storage circuit includes a second capacitor, a first end of the second capacitor is connected to the pull-up node, and a second end of the second capacitor is connected to the output end.

17. The shift register according to claim 2, wherein the output pull-down circuit includes an eighth transistor, a first electrode of the eighth transistor is connected to the output end, a gate electrode of the eighth transistor is connected to the pull-down node, and a second electrode of the eighth transistor is connected to the first power supply end to receive the first power supply voltage.

18. The shift register according to claim 2, wherein the pull-up circuit of the pull-down node includes a ninth transistor, a first electrode of the ninth transistor is connected to the pull-down node, a gate electrode of the ninth transistor is connected to the second clock signal end to receive the second clock signal, and a second electrode of the ninth transistor is connected to the second power supply end to receive the second power supply voltage.

19. A gate driving circuit, comprising the shift register according to claim 1.

20. A display panel, comprising the gate driving circuit according to claim 19.

* * * * *